US011182249B1

(12) United States Patent
Blaum et al.

(10) Patent No.: US 11,182,249 B1
(45) Date of Patent: Nov. 23, 2021

(54) BLOCK ID ENCODING IN AN ERASURE CODED STORAGE SYSTEM

(71) Applicant: International Business Machines Corporation, Armonk, NY (US)

(72) Inventors: Mario Blaum, San Jose, CA (US); Steven Robert Hetzler, Los Altos, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/911,114

(22) Filed: Jun. 24, 2020

(51) Int. Cl.
  *G06F 11/00* (2006.01)
  *G06F 11/10* (2006.01)
  *H03M 13/15* (2006.01)

(52) U.S. Cl.
  CPC ....... *G06F 11/1076* (2013.01); *H03M 13/154* (2013.01); *H03M 13/1515* (2013.01)

(58) Field of Classification Search
  None
  See application file for complete search history.

(56) References Cited

U.S. PATENT DOCUMENTS

| | | | |
|---|---|---|---|
| 8,671,265 B2 * | 3/2014 | Wright | G06F 3/0689 711/206 |
| 9,424,131 B2 | 8/2016 | Tang et al. | |
| 10,044,374 B2 | 8/2018 | Arslan et al. | |
| 10,218,789 B2 | 2/2019 | Yang et al. | |
| 10,536,167 B2 | 1/2020 | Pavlov et al. | |
| 10,558,565 B2 | 2/2020 | Oltean et al. | |
| 10,664,347 B2 * | 5/2020 | Anderson | H03M 13/1191 |
| 10,698,765 B2 * | 6/2020 | Jin | G06F 11/1464 |
| 10,929,046 B2 * | 2/2021 | Coleman | G06F 3/0685 |
| 2013/0205183 A1 * | 8/2013 | Fillingim | G06F 12/0253 714/773 |

(Continued)

FOREIGN PATENT DOCUMENTS

| | | |
|---|---|---|
| WO | 2013164228 A1 | 11/2013 |
| WO | 2014151758 A1 | 9/2014 |

(Continued)

OTHER PUBLICATIONS

Cong Wang, Qian Wang, Kui Ren and Wenjing Lou, "Ensuring data storage security in Cloud Computing," 2009 17th International Workshop on Quality of Service, 2009, pp. 1-9, doi: 10.1109/IWQoS.2009.5201385. (Year: 2009).*

(Continued)

*Primary Examiner* — Daniel F. McMahon
(74) *Attorney, Agent, or Firm* — Zilka-Kotab, P.C.

(57) ABSTRACT

A data storage system includes a plurality of data blocks. A set of data blocks are protected by an erasure correcting code and each of the data blocks in the set of data blocks includes block identification information. The data storage system includes a processor and logic integrated with the processor, executable by the processor, or integrated with and executable by the processor. The logic is configured to verify the block identification information for each of the data blocks in the set of data blocks at the time of read and, as part of reconstructing a data block, reconstruct the block identification information for the reconstructed data block, and verify the block identification information.

25 Claims, 7 Drawing Sheets

(56) References Cited

U.S. PATENT DOCUMENTS

| | | | |
|---|---|---|---|
| 2013/0332796 A1* | 12/2013 | Ellis | G06F 11/1048 714/763 |
| 2015/0127974 A1 | 5/2015 | Jiekak et al. | |
| 2016/0092298 A1* | 3/2016 | Grube | H03M 13/616 714/776 |
| 2016/0217033 A1 | 7/2016 | Thatcher et al. | |
| 2017/0033806 A1* | 2/2017 | Arslan | G06F 3/0689 |
| 2017/0125127 A1* | 5/2017 | Kim | G06F 11/1048 |
| 2019/0220356 A1 | 7/2019 | Zhang et al. | |

FOREIGN PATENT DOCUMENTS

| | | |
|---|---|---|
| WO | 2014209993 A1 | 12/2014 |
| WO | 2018001110 A1 | 1/2018 |
| WO | 2018018827 A1 | 2/2018 |
| WO | 2020027911 A1 | 2/2020 |

OTHER PUBLICATIONS

Bao et al., "Reducing network cost of data repair in erasure-coded cross-datacenter storage," Future Generation Computer Systems, vol. 102, 2020, pp. 494-506.

Blaum et al., U.S. Appl. No. 16/262,599, filed Jan. 30, 2019.

Blaum et al., U.S. Appl. No. 16/395,065, filed Apr. 25, 2019.

Blaum, M., "A Family of MDS Array Codes with Minimal Number of Encoding Operations," ISIT, Jul. 2006, pp. 2784-2788.

Blaum et al., "EVENODD: An Efficient Scheme for Tolerating Double Disk Failures in RAID Architectures," IEEE Transactions on Computers, vol. 44, No. 2, Feb. 1995, pp. 192-202.

Blaum et al., "The EVENODD Code and its Generalization: An Effcient Scheme for Tolerating Multiple Disk Failures in RAID Architectures," High Performance Mass Storage and Parallel I/O: Technologies and Applications, Chapter 8, 2002, pp. 93-117.

Blaum et al., "MDS Array Codes with Independent Parity Symbols," IEEE Transactions on Information Theory, vol. 42, No. 2, Mar. 1996, pp. 529-542.

Blaum et al., "New Array Codes for Multiple Phased Burst Correction," IEEE Transactions on Information Theory, vol. 39, No. 1, Jan. 1993, pp. 66-77.

Corbett et al., "Row-Diagonal Parity for Double Disk Failure Correction," Proceedings of the Third USENIX Conference on File and Storage Technologies, 2004, 15 pages.

Fujita, H., "Modified Low-Density MDS Array Codes," ISIT, Jul. 2006, pp. 2789-2793.

Hou et al., "A Unified Form of EVENODD and RDP Codes and Their Efficient Decoding," IEEE Transactions on Communications, Mar. 2018, pp. 1-30.

Macwilliams, et al., "The Theory of Error-Correcting Codes," North Holland Mathematical Library, vol. 16,1977, pp. 1-771.

International Search Report and Written Opinion from PCT Application No. PCT/IB2021/055484, dated Sep. 28, 2021.

* cited by examiner

| Block # | 0 | 1 | 2 | 3 | 4 | 5 (parity) |
|---|---|---|---|---|---|---|
| Block ID | 11101 000 | 11101 001 | 11101 010 | 11101 100 | 11101 1000 | 11101 1111 |

FIG. 4

| Block # | Virtual | 0 | 1 | 2 | 3 | 4 (parity) |
|---|---|---|---|---|---|---|
| Block ID | 11101 000 | 11101 001 | 11101 110 | 11101 010 | 11101 101 | 11101 000 |

FIG. 5

| Block # | 0 (Virtual) | 1 (Virtual) | 2 | 3 | 4 | 5 | 6 | 7 (parity) |
|---|---|---|---|---|---|---|---|---|
| Block ID | 11101 000 | 11101 001 | 11101 010 | 11101 011 | 11101 100 | 11101 101 | 11101 110 | 11101 111 |

FIG. 6

|   | 0 | 1 | 2 | 3 | 4 | 5 (P) |
|---|---|---|---|---|---|---|
| 0 | 0000 0000 | 0000 0001 | 0000 0010 | 0000 0100 | 0000 1000 | 0000 1111 |
| 1 | 0001 0000 | 0001 0001 | 0001 0010 | 0001 0100 | 0001 1000 | 0001 1111 |
| 2 | 0010 0000 | 0010 0001 | 0010 0010 | 0010 0100 | 0010 1000 | 0010 1111 |
| 3 | 0100 0000 | 0100 0001 | 0100 0010 | 0100 0100 | 0100 1000 | 0100 1111 |
| 4 | 1000 0000 | 1000 0001 | 1000 0010 | 1000 0100 | 1000 1000 | 1000 1111 |
| 5 (Q) | 1111 0000 | 1111 0001 | 1111 0010 | 1111 0100 | 1111 1000 | 1111 1111 |

FIG. 7

|   | 0 (Virtual) | 1 | 2 | 3 | 4 | 5 | 6 | 7 (P) |
|---|---|---|---|---|---|---|---|---|
| 0 (Virtual) | 000 000 | 000 001 | 000 010 | 000 011 | 000 100 | 000 101 | 000 110 | 000 111 |
| 1 | 001 000 | 001 001 | 001 010 | 001 011 | 001 100 | 001 101 | 001 110 | 001 111 |
| 2 | 010 000 | 010 001 | 010 010 | 010 011 | 010 100 | 010 101 | 010 110 | 010 111 |
| 3 | 011 000 | 011 001 | 011 010 | 011 011 | 011 100 | 011 101 | 011 110 | 011 111 |
| 4 | 100 000 | 100 001 | 100 010 | 100 011 | 100 100 | 100 101 | 100 110 | 100 111 |
| 5 | 101 000 | 101 001 | 101 010 | 101 011 | 101 100 | 101 101 | 101 110 | 101 111 |
| 6 | 110 000 | 110 001 | 110 010 | 110 011 | 110 100 | 110 101 | 110 110 | 110 111 |
| 7 | 111 000 | 111 001 | 111 010 | 111 011 | 111 100 | 111 101 | 111 110 | 111 111 |

FIG. 8

|   |   |   |   |   |
|---|---|---|---|---|
| 1 | 0 | 0 | 1 | 0 |
| 1 | 1 | 1 | 0 | 1 |
| 0 | 1 | 1 | 0 | 0 |
| 0 | 1 | 1 | 0 | 0 |
| 0 | 1 | 1 | 1 | 1 |

FIG. 9

| $(c_0, c_0)$ | $(c_6, c_5)$ | $(c_5, c_3)$ | $(c_4, c_1)$ | $(c_3, c_6)$ | $(c_2, c_4)$ | $(c_1, c_2)$ |
|---|---|---|---|---|---|---|
| $(c_1, c_1)$ | $(c_0, c_6)$ | $(c_6, c_4)$ | $(c_5, c_2)$ | $(c_4, c_0)$ | $(c_3, c_5)$ | $(c_2, c_3)$ |
| $(c_2, c_2)$ | $(c_1, c_0)$ | $(c_0, c_5)$ | $(c_6, c_3)$ | $(c_5, c_1)$ | $(c_4, c_6)$ | $(c_3, c_4)$ |
| $(c_3, c_3)$ | $(c_2, c_1)$ | $(c_1, c_6)$ | $(c_0, c_4)$ | $(c_6, c_2)$ | $(c_5, c_0)$ | $(c_4, c_5)$ |
| $(c_4, c_4)$ | $(c_3, c_2)$ | $(c_2, c_0)$ | $(c_1, c_5)$ | $(c_0, c_3)$ | $(c_6, c_1)$ | $(c_5, c_6)$ |
| $(c_5, c_5)$ | $(c_4, c_3)$ | $(c_3, c_1)$ | $(c_2, c_6)$ | $(c_1, c_4)$ | $(c_0, c_2)$ | $(c_6, c_0)$ |
| $(c_6, c_6)$ | $(c_5, c_4)$ | $(c_4, c_2)$ | $(c_3, c_0)$ | $(c_2, c_5)$ | $(c_1, c_3)$ | $(c_0, c_1)$ |

FIG. 10

BLOCK ID ENCODING IN AN ERASURE CODED STORAGE SYSTEM

BACKGROUND

The present invention relates to block ID encoding, and more specifically, this invention relates to block ID encoding in erasure coded storage systems.

Blocks of data which are stored in storage devices are conventionally preceded by a unique string of bits that identifies the block (e.g., the block ID). Blocks are protected by one or more parity blocks in many architectures, such as RAID 5, product codes, etc. Other methods for protecting blocks include XORing data blocks in order to obtain parity blocks. The block IDs are conventionally excluded from the XOR operations. Parity block(s) often have an ID that coincides with one or more of the data block IDs. It would be desirable to include the block IDs in XOR operations. It would be further desirable to allow for parity block IDs to be unique.

SUMMARY

A data storage system, according to one aspect, includes a plurality of data blocks. A set of data blocks are protected by an erasure correcting code and each of the data blocks in the set of data blocks includes block identification information. The data storage system includes a processor and logic integrated with the processor, executable by the processor, or integrated with and executable by the processor. The logic is configured to verify the block identification information for each of the data blocks in the set of data blocks at the time of read and, as part of reconstructing a data block, reconstruct the block identification information for the reconstructed data block, and verify the block identification information. The data system improves data integrity by verifying that the correct data blocks are used in the reconstruct operation.

The data storage system optionally includes at least two parity blocks. The at least two parity blocks are used to expand the benefits of the data system to multi-dimensional codes.

A data storage system, according to another aspect, includes at least two parity blocks and a plurality of data blocks. A set of data blocks are protected by an erasure correcting code and each of the data blocks in the set of data blocks includes block identification information. The block identification information of the data blocks and of the at least two parity blocks are symbols in a codeword of a Reed-Solomon code such that all the symbols are different. The data storage system also includes a processor and logic integrated with the processor, executable by the processor, or integrated with and executable by the processor. The logic is configured to verify the block identification information for each of the data blocks in the set of data blocks at the time of read and, as part of reconstructing a data block, reconstruct the block identification information for the reconstructed data block, and verify the block identification information. The logic is also configured to return the block identification information and the reconstructed data block for providing end-to-end protection in the storage system. The data system improves data integrity by protecting the system from using incorrect and/or corrupted data blocks.

The data storage system optionally includes logic configured to determine that the verification of the block identification information fails. In response to determining that the verification of the block identification information fails, the data storage system includes logic configured to declare that the data block is erased. This optional logic provides the benefit of detecting whether a block is from an incorrect location on reconstruct and identifying that the block has been erased.

A computer-implemented method, according to another aspect, includes, for a plurality of data blocks in a data storage system, verifying block identification information for each of the data blocks in a set of data blocks at the time of read. A set of data blocks are protected by an erasure correcting code and each of the data blocks in the set of data blocks includes the block identification information. The method also includes, as part of reconstructing a data block, reconstructing the block identification information for the reconstructed data block, and verifying the block identification information. The method improves data integrity by verifying that the correct data blocks are used in the reconstruct operation.

The method optionally includes that the block identification information for each of the data blocks is unique to the respective data blocks. The unique aspects of the block identification information provides that the block identification information may be recovered and verified via the reconstruct operation.

A computer-implemented method, according to another aspect, includes, for a plurality of data blocks in a data storage system, verifying block identification information for each of the data blocks in a set of data blocks at the time of read. The data storage system includes at least two parity blocks. A set of data blocks are protected by an erasure correcting code and each of the data blocks in the set of data blocks includes the block identification information. The block identification information of the data blocks and of the at least two parity blocks are symbols in a codeword of a Reed-Solomon code such that all the symbols are different. The method also includes, as part of reconstructing a data block, reconstructing the block identification information for the reconstructed data block, and verifying the block identification information. The method also includes returning the block identification information and the reconstructed data block for providing end-to-end protection in the storage system. The method improves data integrity in multi-dimensional codes by verifying that the correct data blocks are used in the reconstruct operation.

A computer program product, according to yet another aspect, includes one or more computer readable storage media, and program instructions collectively stored on the one or more computer readable storage media. The program instructions include program instructions to, for a plurality of data blocks in a data storage system, verify, by the computer, block identification information for each of the data blocks in a set of data blocks at the time of read. A set of data blocks are protected by an erasure correcting code and each of the data blocks in the set of data blocks includes the block identification information. The program instructions also include program instructions to, as part of reconstructing a data block, reconstruct, by the computer, the block identification information for the reconstructed data block, and verifying the block identification information. The computer program product improves data integrity by protecting against corruption mechanisms occurring after block read operations.

Other aspects and aspects of the present invention will become apparent from the following detailed description, which, when taken in conjunction with the drawings, illustrate by way of example the principles of the invention.

BRIEF DESCRIPTION OF THE DRAWINGS

FIG. 4 is an exemplary LID encoding of block IDs for m=5 with a code set value of 29 (11101), in accordance with one aspect of the present invention.

FIG. 5 is an exemplary LID encoding of block IDs for m=4 with a code set value of 29 (11101) and a virtual column, in accordance with one aspect of the present invention.

FIG. 6 is an exemplary LID encoding of block IDs for m=5 with a code set value of 29 (11101) and two virtual columns, in accordance with one aspect of the present invention.

FIG. 7 is a 6×6 product code with single row and single column parity encoded using a LID code, in accordance with one aspect of the present invention.

FIG. 8 is a 7×7 product code with single row and single column parity encoded using a LID code, in accordance with one aspect of the present invention.

FIG. 9 is an element in EBR(5, 3) having even parity in each column as well as in each line of slope 0, 1, and 2, in accordance with one aspect of the present invention.

FIG. 10 is an exemplary assignment for an EBR(7, r) code for $1 \leq r \leq 4$, in accordance with one aspect of the present invention.

DETAILED DESCRIPTION

Figure 1:
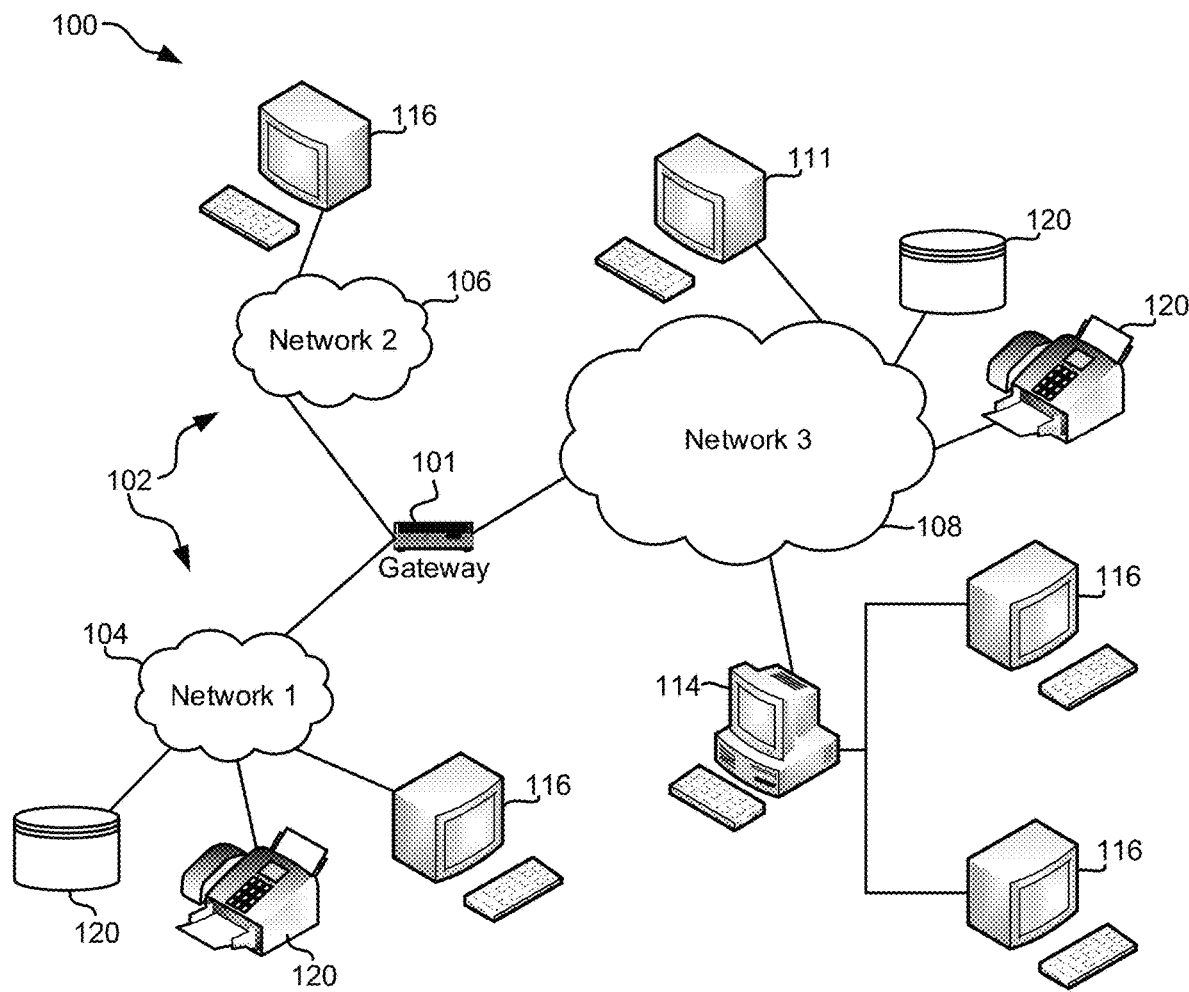
FIG. 1 is a diagram of a network architecture, in accordance with one aspect of the present invention.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred aspects of systems, methods, and computer program products for block ID encoding in erasure coded storage systems.

In one general aspect, a data storage system includes a plurality of data blocks. A set of data blocks are protected by an erasure correcting code and each of the data blocks in the set of data blocks includes block identification information. The data storage system includes a processor and logic integrated with the processor, executable by the processor, or integrated with and executable by the processor. The logic is configured to verify the block identification information for each of the data blocks in the set of data blocks at the time of read and, as part of reconstructing a data block, reconstruct the block identification information for the reconstructed data block, and verify the block identification information.

In another general aspect, a data storage system, includes at least two parity blocks and a plurality of data blocks. A set of data blocks are protected by an erasure correcting code and each of the data blocks in the set of data blocks includes block identification information. The block identification information of the data blocks and of the at least two parity blocks are symbols in a codeword of a Reed-Solomon code such that all the symbols are different. The data storage system also includes a processor and logic integrated with the processor, executable by the processor, or integrated with and executable by the processor. The logic is configured to verify the block identification information for each of the data blocks in the set of data blocks at the time of read and, as part of reconstructing a data block, reconstruct the block identification information for the reconstructed data block, and verify the block identification information. The logic is also configured to return the block identification information and the reconstructed data block for providing end-to-end protection in the storage system.

In yet another general aspect, a computer-implemented method, according to another aspect, includes, for a plurality of data blocks in a data storage system, verifying block identification information for each of the data blocks in a set of data blocks at the time of read. A set of data blocks are protected by an erasure correcting code and each of the data blocks in the set of data blocks includes the block identification information. The method also includes, as part of reconstructing a data block, reconstructing the block identification information for the reconstructed data block, and verifying the block identification information.

In another general aspect, a computer-implemented method, includes, for a plurality of data blocks in a data storage system, verifying block identification information for each of the data blocks in a set of data blocks at the time of read. The data storage system includes at least two parity blocks. A set of data blocks are protected by an erasure correcting code and each of the data blocks in the set of data blocks includes the block identification information. The block identification information of the data blocks and of the at least two parity blocks are symbols in a codeword of a Reed-Solomon code such that all the symbols are different. The method also includes, as part of reconstructing a data block, reconstructing the block identification information for the reconstructed data block, and verifying the block identification information. The method also includes returning the block identification information and the reconstructed data block for providing end-to-end protection in the storage system.

In another general aspect, a computer program product, includes one or more computer readable storage media, and program instructions collectively stored on the one or more computer readable storage media. The program instructions include program instructions to, for a plurality of data blocks in a data storage system, verify, by the computer, block identification information for each of the data blocks in a set of data blocks at the time of read. A set of data blocks are protected by an erasure correcting code and each of the data blocks in the set of data blocks includes the block identification information. The program instructions also include program instructions to, as part of reconstructing a data block, reconstruct, by the computer, the block identification information for the reconstructed data block, and verifying the block identification information.

FIG. 1 illustrates an architecture 100, in accordance with one aspect. As shown in FIG. 1, a plurality of remote networks 102 are provided including a first remote network 104 and a second remote network 106. A gateway 101 may be coupled between the remote networks 102 and a proximate network 108. In the context of the present architecture 100, the networks 104, 106 may each take any form including, but not limited to a local area network (LAN), a wide area network (WAN) such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. User devices 116 may also be connected directly through one of the networks 104, 106, 108. Such user devices 116 may include a desktop computer, lap-top computer, hand-held computer, printer, or any other type of logic. It should be noted that a user device 111 may also be directly coupled to any of the networks, in one aspect.

A peripheral 120 or series of peripherals 120, e.g., facsimile machines, printers, networked and/or local storage units or systems, etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX® system which emulates an IBM® z/OS® environment (IBM and all IBM-based trademarks and logos are trademarks or registered trademarks of International Business Machines Corporation and/or its affiliates), a UNIX® system which virtually hosts a known operating system environment, an operating system which emulates an IBM® z/OS® environment, etc. This virtualization and/or emulation may be enhanced through the use of VMware® software, in some aspects.

In more approaches, one or more networks 104, 106, 108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used.

Figure 2:
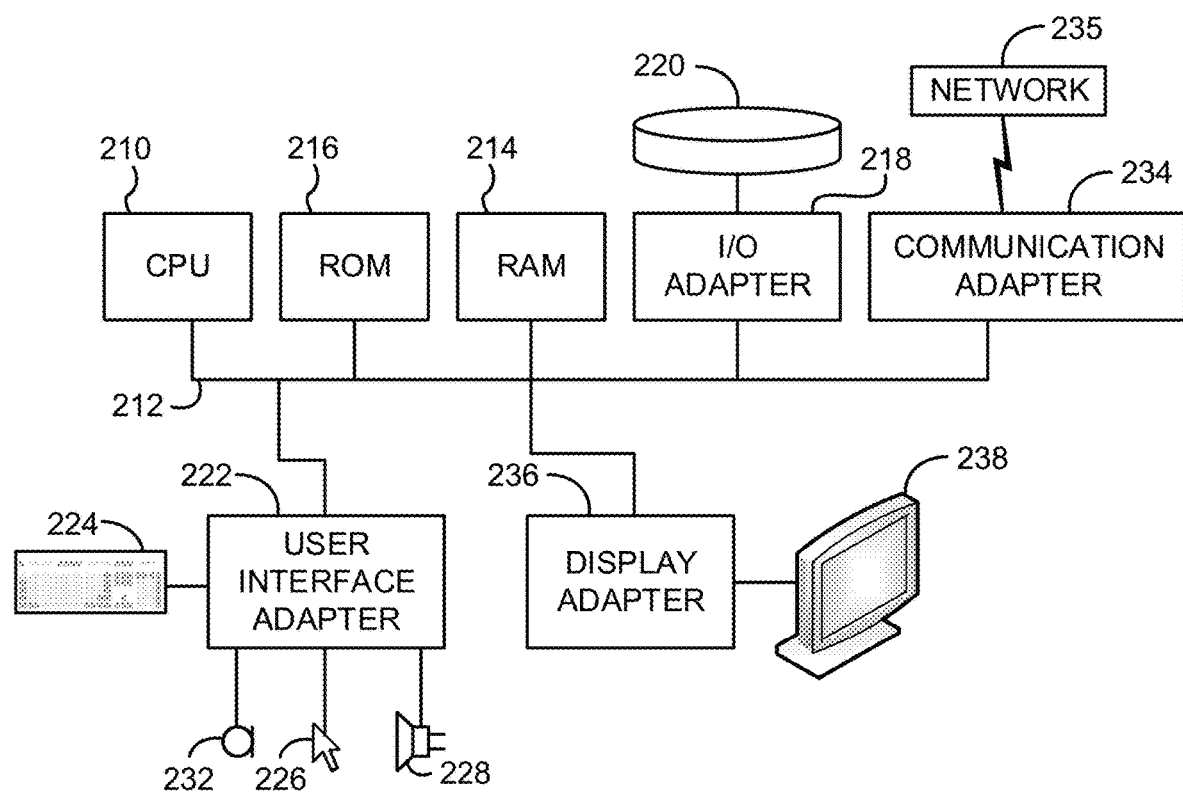
FIG. 2 is a diagram of a representative hardware environment that may be associated with the servers and/or clients of FIG. 1, in accordance with one aspect of the present invention.

FIG. 2 shows a representative hardware environment associated with a user device 116 and/or server 114 of FIG. 1, in accordance with one aspect. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an input/output (I/O) adapter 218 for connecting peripheral devices such as disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft Windows® Operating System (OS), a macOS®, a UNIX® OS, etc. It will be appreciated that a preferred aspect may also be implemented on platforms and operating systems other than those mentioned. A preferred aspect may be written using eXtensible Markup Language (XML), C, and/or C++ language, or other programming languages, along with an object oriented programming methodology. Object oriented programming (OOP), which has become increasingly used to develop complex applications, may be used.

Figure 3:
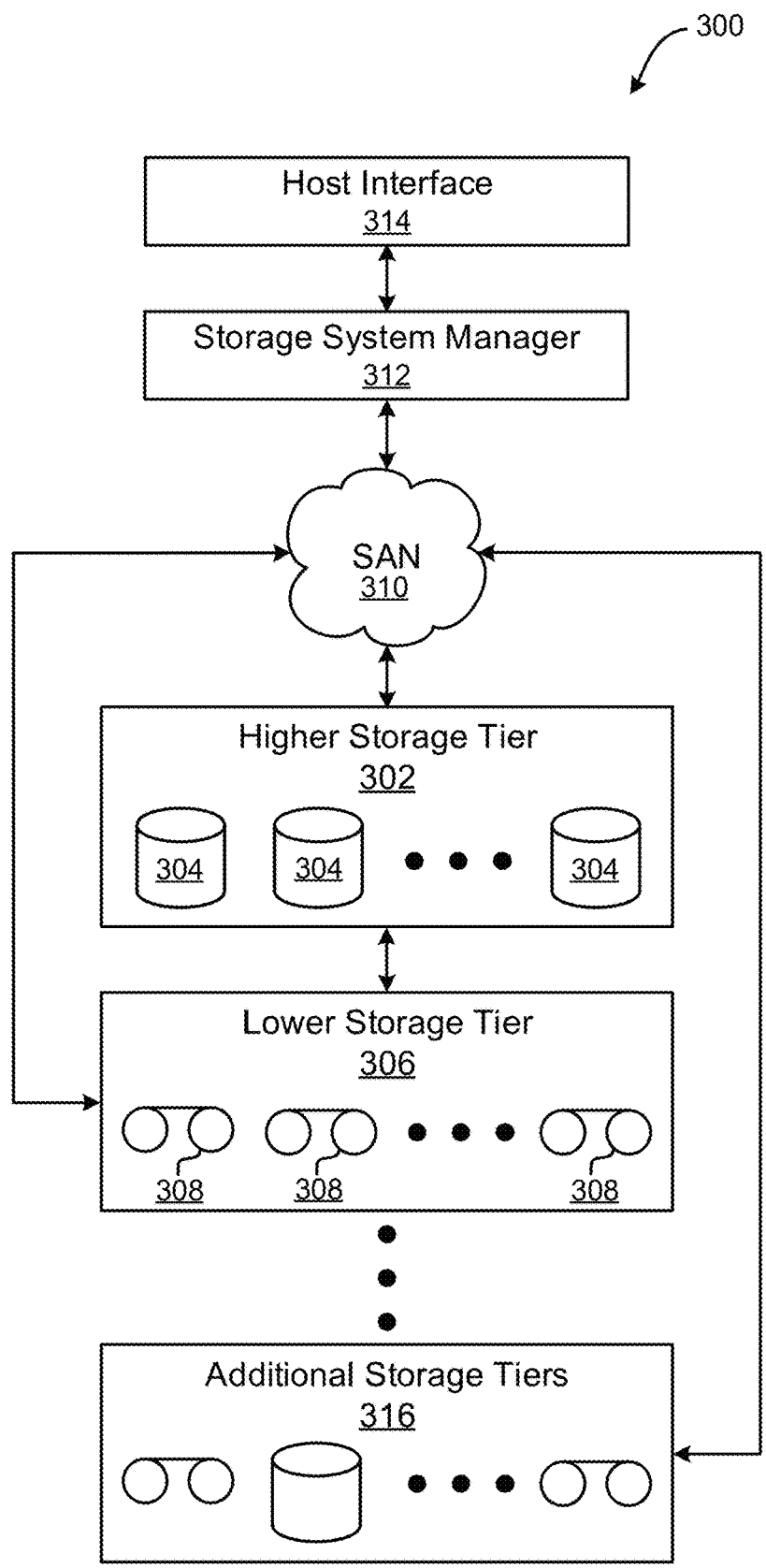
FIG. 3 is a diagram of a tiered data storage system, in accordance with one aspect of the present invention.

Now referring to FIG. 3, a storage system 300 is shown according to one aspect. Note that some of the elements shown in FIG. 3 may be implemented as hardware and/or software, according to various aspects. The storage system 300 may include a storage system manager 312 for communicating with a plurality of media and/or drives on at least one higher storage tier 302 and at least one lower storage tier 306. The higher storage tier(s) 302 preferably may include one or more random access and/or direct access media 304, such as hard disks in hard disk drives (HDDs), nonvolatile memory (NVM), solid state memory in solid state drives (SSDs), flash memory, SSD arrays, flash memory arrays, etc., and/or others noted herein or known in the art. The lower storage tier(s) 306 may preferably include one or more lower performing storage media 308, including sequential access media such as magnetic tape in tape drives and/or optical media, slower accessing HDDs, slower accessing SSDs, etc., and/or others noted herein or known in the art. One or more additional storage tiers 316 may include any combination of storage memory media as desired by a designer of the system 300. Also, any of the higher storage tiers 302 and/or the lower storage tiers 306 may include some combination of storage devices and/or storage media.

The storage system manager 312 may communicate with the drives and/or storage media 304, 308 on the higher storage tier(s) 302 and lower storage tier(s) 306 through a network 310, such as a storage area network (SAN), as shown in FIG. 3, or some other suitable network type. The storage system manager 312 may also communicate with one or more host systems (not shown) through a host interface 314, which may or may not be a part of the storage system manager 312. The storage system manager 312 and/or any other component of the storage system 300 may be implemented in hardware and/or software, and may make use of a processor (not shown) for executing commands of a type known in the art, such as a central processing unit (CPU), a field programmable gate array (FPGA), an application specific integrated circuit (ASIC), etc. Of course, any arrangement of a storage system may be used, as will be apparent to those of skill in the art upon reading the present description.

In more aspects, the storage system 300 may include any number of data storage tiers, and may include the same or different storage memory media within each storage tier. For example, each data storage tier may include the same type of storage memory media, such as HDDs, SSDs, sequential access media (tape in tape drives, optical disc in optical disc drives, etc.), direct access media (CD-ROM, DVD-ROM, etc.), or any combination of media storage types. In one such configuration, a higher storage tier 302, may include a majority of SSD storage media for storing data in a higher performing storage environment, and remaining storage tiers, including lower storage tier 306 and additional storage tiers 316 may include any combination of SSDs, HDDs, tape drives, etc., for storing data in a lower performing storage environment. In this way, more frequently accessed data, data having a higher priority, data needing to be accessed more quickly, etc., may be stored to the higher storage tier 302, while data not having one of these attributes may be stored to the additional storage tiers 316, including lower storage tier 306. Of course, one of skill in the art, upon reading the present descriptions, may devise many other combinations of storage media types to implement into different storage schemes, according to the aspects presented herein.

According to some aspects, the storage system (such as 300) may include logic configured to receive a request to open a data set, logic configured to determine if the requested data set is stored to a lower storage tier 306 of a tiered data storage system 300 in multiple associated portions, logic configured to move each associated portion of the requested data set to a higher storage tier 302 of the tiered data storage system 300, and logic configured to assemble the requested data set on the higher storage tier 302 of the tiered data storage system 300 from the associated portions.

Of course, this logic may be implemented as a method on any device and/or system or as a computer program product, according to various aspects.

Data integrity is a significant problem in storage system technology. Most enterprise storage systems utilize devices supporting T10DIF (Data Integrity Field). T10DIF involves storing extra information in a storage block on a device. This information may include a data check, such as a cyclic redundancy check (CRC), a block ID, a write sequence number, etc. When the data is read, these values must match the expected values. Some of this information, such as a write sequence number, is compared to a value stored elsewhere. The matching provides the ability to verify the data and the identity of the block on a read operation.

Erasure correcting codes are widely used to protect storage systems against data loss events. Prior art methods, such as T10DIF, encode information outside a system-level erasure correcting code used to protect against corruption of the data. These prior art methods verify the information at the time of reading a block but cannot verify the information for reconstructed data blocks. It would be desirable to provide a method to verify block identity information following a reconstruction operation for protecting against corruption mechanisms occurring after a block read operation. For example, a buffer addressing error that results in data from a block not belonging to a particular parity equation being used during the reconstruction.

In a storage system, a set of data blocks may be protected by an erasure correcting code. Data from a missing block may be reconstructed via the erasure correcting code. For this operation to produce the correct result, it is critical that all the blocks used in the reconstruct operation be from the proper locations and contain the same data that was used during the encoding process. There are many factors that potentially cause the data from incorrect blocks to be delivered to the erasure code. These include situations such as where a prior write operation was written to an incorrect location (e.g., off-track write in HDD), addressing errors when reading from a device, buffer errors, etc. In the prior art, such as T10DIF, the block identification information is verifiable at the time of read, but not end-to-end through a reconstruct operation as the block identification information is not encoded into the erasure correcting code. At least some of the approaches described herein provide strong protection due to block identification information for each block in a read operation which is verifiable at the time of reading and verifiable for reconstructed data. Other approaches of the present disclosure use block identification information end-to-end protection for block write sequence numbers and the block identification information is encoded into the erasure correcting code (e.g., protection is provided throughout the read and write process). Thus, if an error occurs during the reconstruction operation, resulting in an incorrect block being used in reconstruction, the error is detected, and the corruption is prevented by using of various aspects described herein. In some cases, it may be possible to correct the corruption. The block identification information may include a block identification number, a code set number, a write sequence number, etc., or any combination thereof.

To illustrate an exemplary problem with conventional technologies discussed above, identify a storage block with an ID by assigning a number to the storage block. For example, assume there are 7 storage blocks containing data. In a RAID 5 architecture, an $8^{th}$ storage block is the XOR of the 7 data storage blocks. If the 8 storage blocks are numbered from 0 to 7, an ID may be assigned as the corresponding number in binary representation (e.g., storage block 0 is assigned ID 000, storage block 1 is assigned ID 001, etc., up to storage block 7 which is assigned ID 111). As stated above, storage block 7 is the XOR of storage blocks 0 through 6. XORing the IDs of storage blocks 0 to 6 obtains 111, which is the ID of block 7. In this particular case, the assignment of the binary numbers as IDs has the desired property and the same is true if the number of data blocks is $2^n-1$ for any number n (e.g., in the example above, n=3). However, in a RAID 5 architecture, requiring that the number of data blocks be $2^n-1$ is limiting. For example, using the same example, assume that 5 storage blocks contain data, and a $6^{th}$ storage block is the XOR of the other 5 storage blocks. Applying the same ID method of assigning the binary representation of the number i to block i, the XOR of IDs 0 to 4 gives 100 and the ID of block 5 (e.g., now the parity storage block) is 101. This assignment does not work for this approach and the prior art does not solve these deficiencies.

Various aspects of the present disclosure provide a method for encoding unique block IDs in each block of an erasure coded system, such that the block ID may be recovered via a reconstruct operation. At least some aspects of the present disclosure provide a method for encoding other information, such as write sequence numbers, in a manner such that the information may be recovered via a reconstruct operation.

Mathematically, given m distinct vectors of length n, various aspects of the present disclosure obtain an (m+1)th vector as the XOR of such m distinct vectors which is also distinct from the original m vectors. In preferred aspects, n is minimal with the foregoing property. For example, if $m=2^n$ and all possible $2^n$ vectors of length n are assigned, their XOR is the zero-vector of length n. The zero vector is one of the $2^n$ vectors of length n. This set of $2^n$ vectors of length n does not have the desired property. Vectors having a length of at least n+1 are necessary for this desired property. The value of n is optimized according to the various aspects described herein.

In one aspect, consider an erasure correcting code covering a set of m blocks, each with block identification number (e.g., a block ID in some instances) represented by a binary vector of length n (e.g., $v_i$ where $0 \le i \le m-1$). To guarantee that each block ID is unique (e.g., such that all blocks are distinguishable), and, if the erasure correcting code consists of a simple parity code, each block ID is distinguishable from the XOR of all the IDs.

Definition 1

Given integers m and n, a linear ID (LID) code, denoted LID(m, n), is a set of m+1 distinct (binary) vectors $v_i$, $0 \le i \le m$, of length n, such that, denoting by 0 a zero vector of length n, $$\bigoplus_{i=1}^{m} v_i = 0 \qquad (1)$$

To achieve the smallest possible length n for an LID(m, n), a lower bound on n is stated in the following lemma:

Lemma 1

Consider an LID(m, n) code as given by Definition 1 and let $b = \lceil \log_2(m+1) \rceil$. Then, $n \ge b$ if $m \ne 2^b - 3$ (2)

$n \ge b+1$ if $m = 2^b - 3$ (3)

Assume that $n \le b-1$. The number of vectors of length n is $2^n \le 2^{b-1} < m+1$. It is not possible that there are m+1 distinct vectors of length n for $v_i$, $0 \le i \le m$, so (2) follows.

Assume that $m = 2^b - 3$, n=b and there are $2^b - 2$ vectors $v_i$ of length b, $0 \le i \le 2^b - 3$, satisfying Definition 1. Let u and w be the remaining two vectors of length b. Since $$\left( \bigoplus_{i=0}^{2^b-3} v_i \right) \oplus u \oplus w = 0$$

and, by property (1).

$$\bigoplus_{i=0}^{2^b-3} v_i = 0,$$

then u=w and this is a contradiction. Constructions meeting bounds (2) and (3) with equality are discussed in detail below.

Construction A

Assume that $m = 2^n - 1$ for $n \ge 2$. Consider the set of all possible $2^n$ vectors $v_i$ of length n. Since $$\bigoplus_{i=0}^{2^n-1} v_i = 0$$

and $b = \lceil \log_2(2^n) \rceil = n$, this set satisfies Definition 1, and bound (2) is met with equality.

Example 1

Assume that $m = 2^4 - 1 = 15$. The set of 16 non-zero vectors of length 4 is

| 0000 | 1000 |
|------|------|
| 0001 | 1001 |
| 0010 | 1010 |
| 0011 | 1011 |
| 0100 | 1100 |
| 0101 | 1101 |
| 0110 | 1110 |
| 0111 | 1111 |

The XOR of the foregoing vectors is (0000). Definition 1 is satisfied, and the set is a LID code.

Construction B

Denote by 1 the all-one vector (11 . . . 1) of length n. Assume that m=2t and let $n = \lceil \log_2(2t+1) \rceil$. Then, take t different pairs consisting of a vector of length n and its complement for each pair, except for the pair {0, 1}. Then, take the set of m+1 vectors consisting of all such t pairs together with 0 if t is even and 1 if t is odd. In both cases, the set satisfies Definition 1. The set constitutes an LID code and bound (2) is met.

Example 2

Assume that m=14=(2)(7), then, $n = \lceil \log_2(15) \rceil = 4$. The 14 non-zero vectors of length 4 consisting of all possible pairs of a vector and its complement, except for the pair {0000, 1111}, are:

| 0001 | 0010 | 0011 | 0100 | 0101 | 0110 | 0111 |
|------|------|------|------|------|------|------|
| 1110 | 1101 | 1100 | 1011 | 1010 | 1001 | 1000 |

The XOR of the foregoing vectors with (1111) is (0000). The foregoing set of 15 vectors satisfies Definition 1 and bound (2) is met with equality.

If m=12=(2)(6), $n = \lceil \log_2(13) \rceil = 4$, taking the first 6 pairs above, the XOR of such 12 vectors with vector (0000) is (0000). This set of 13 vectors satisfies Definition 1 and bound (2) is met with equality.

Construction C

Assume that $m = 2t+1 \le 2^n - 5$, where $n = \lceil \log_2(m+1) \rceil$. Take the following three vectors of length n:

$v_0 = (00 \ldots 001)$ $v_1 = (00 \ldots 010)$ $v_2 = (11 \ldots 100)$

Take the next m−3 different vectors divided into pairs of vectors that are complements of each other, excluding the eight vectors 0, $v_0$, $v_1$, $v_2$ and their complements. Such a choice is possible since m−3 is even and $m-3 \le 2^n - 8$. Consider the set of m+1 different vectors consisting of such m−3 vectors, $v_0$, $v_1$, $v_2$, and 0 if t is even or 1 if t is odd. Since $v_0 \oplus v_1 \oplus v_2 = 1$, the m+1 vectors satisfy Definition 1. The set of vectors constitutes an LID code. Since $b = \lceil \log_2(m+1) \rceil = n$, bound (2) is satisfied with equality.

Example 3

Assume that $m=11=(2)(5)+1$, then take $n=4$. Since $t$ is odd, Construction C gives the following set of vectors satisfying Definition 1:

```
0001
0010
1100
0100
1011
0101
1010
0110
1001
0111
1000
1111
```

The XOR of the rows gives (0000).

Construction D

Assume that $m=2^{n-1}-3$, where $n \geq 4$. Take a set of $2^{n-1}-2$ vectors of length n as follows:

1) The first $2^{n-2}-1$ vectors comprise the binary representation of the first $2^{n-2}-1$ numbers i, $0 \leq i \leq 2^{n-2}-2$.

2) The next $2^{n-2}-3$ vectors comprise the binary representation of the numbers i, where $2^{n-2} \leq i \leq 2^{n-1}-4$.

3) The next vector is the binary representation of $2^{n-1}$, e.g., it is the vector (100 . . . 0) of length n.

4) The last vector is the XOR of the previous $2^{n-1}-3$ vectors.

The last vector cannot be one of the first $2^{n-1}-3$ vectors. The XOR of the $2^{n-1}-3$ vectors of length n starts with two 1s and Definition 1 is satisfied. Since $b=\lceil \log_2(2^{n-1}-2) \rceil = n-1$, bound (3) is met with equality.

Example 4

Assume that $m=13=2^4-3$, then take vectors of length $n=5$. Construction D gives the following set of vectors satisfying Definition 1, as well as bound (3) with equality:

```
00000
00001
00010
00011
00100
00101
00110
01000
01001
01010
01011
01100
10000
11011
```

The first 7 vectors correspond to step 1) in Construction D, the next 5 vectors correspond to step 2) in Construction D, the next vector corresponds to step 3) in Construction D, and the last vector, which is the XOR of the 13 previous vectors, is not one of the previous 13 vectors (e.g., none of the previous vectors started with two 1s).

Consider, for example, the case where $m=4$. Using Construction B, the counting set is $\{(001), (110), (010), (101)\}$ and the parity vector is (000). To test, assume that block 2 is erased. Then, $v_2 = v_0 \otimes v_1 \otimes v_3 \otimes v_4 = (001) \otimes (110) \otimes (101) \otimes (000) = (010)$. The various aspects described above provide a method of verifying the block ID of a reconstructed block.

Thus, if a block from an incorrect location is used in a parity equation (e.g., such as through accessing stale data in a buffer), the incorrect block is detected on reconstruct and the block is declared to be erased.

At least some of the aspects described in detail above disclose how to create unique block IDs within the set of blocks in the parity set. In storage systems, it is important to verify the absolute block number in the system. An absolute block number may be created from the block ID and the number of the parity set.

Various approaches disclosed herein are extendable to support unique block IDs when the number of blocks is very large. In each case, a fixed code set value is appended to the block ID in a given equation. In preferred approaches, the number of (data) blocks in the parity equation is odd (e.g., the number of data blocks together with the parity block is even). A virtual block may be added if the code has an even number of (data) blocks. The virtual block has a block ID which is equal to 0 and the code set value. The virtual block is never reconstructed, and the associated block ID value may not be unique. The numbering of actual blocks may start at a block ID equal to 1 which preserves the uniqueness property (e.g., in this case, the starting point may be adjusted to avoid an XOR equal to 0, see FIG. 6, described in detail below).

For example, for $m=5$, use a code of length $n=4$ according to Construction D to add a code set value to each block ID to make it globally unique. Assume that there are 10,000 code sets (e.g., sets of $m+1=6$ blocks, for a total of 60,000 blocks). The code set value may be a simple enumeration appended as a set of bits to each block number. There are an even number of blocks in a code set and the values XOR to 0, see FIG. 4.

Then, consider, for example, $m=4$. The number of blocks is odd where $m+1=5$. A virtual column as discussed above is prepended and given the block ID 0, as shown in FIG. 5. Specifically, FIG. 5 is an exemplary LID encoding of block IDs for $m=4$ with a code set value of 29 (11101) and a virtual column. The code set number is prepended to the block ID encoding. Definition 1 is satisfied, except for the virtual column and, in this case, the parity columns. The parity columns and the virtual column coincide. The two foregoing properties are not relevant where the virtual column is never written.

In the case that $m=2^b-3$ (as shown in FIG. 4 for $m=5$), Lemma 1 gives $n=b+1$. Adjust m to $m=2^b-1$ using two virtual columns (e.g., column 0 and column 1). A code of length of b may obtained using Construction A as illustrated in FIG. 6. FIG. 6 is an exemplary LID encoding of block IDs for $m=5$ with a code set value of 29 (11101) and two virtual columns. Comparing the tables in FIGS. 4 and 6, a bit is saved in FIG. 6 by using these two virtual columns in conjunction with Construction A.

The various aspects of the present invention may be extended to encode multi-dimensional linear parity, such as product codes, Blaum-Roth (BR) codes, Expanded Blaum-Roth (EBR) codes, etc. For such multi-dimensional codes, some of the blocks in a parity equation are parity blocks from other equations. For example, in multi-dimensional codes having equations which are similar to Equation (1) (see Definition 1), some $v_i$s are parities. The requirement that all the elements be different (see Definition 1), may still be met while satisfying all the parity equations according to various approaches described herein which break down the block IDs into element numbers for each parity equation. The block IDs are treated as distinct bit-fields. In a product code, the block ID in the code set is broken down into a row number and a column number. Each are encoded using one of the constructions described above (e.g., depending on whether each is unique). These coded bit-fields are then appended to each other to provide a full set of block IDs. A code set or other value may be appended according to any of the approaches described above.

For example, consider a 6×6 product code with 5+P rows and 5+Q columns as illustrated in FIG. 7. FIG. 7 is a 6×6 product code with single row and single column parity encoded using an LID code. Column 5 is parity P and row 5 is parity Q. The row and column block ID values are computed as in FIG. 4 (e.g., an exemplary LID encoding of block IDs for m=5 with a code set value of 29 (11101)). The computations for obtaining row i and column j for 0≤i≤4 are each performed as in Construction D in preferred approaches. In other approaches, other constructions may be used. The row portion is given by the 4 msbs and row 5 is calculated by XORing the row bits of rows 0 to 4. The column bits have all the same value. The row 5 parity results in 1111 for the row bits and the corresponding columns bits are the same throughout the column. Similarly, the column portion corresponds to the 4 lsbs and column 5 is calculated by XORing the column bits of columns 0 to 4, and the row value for the row bits. The 36 values obtained, as shown in FIG. 7, are distinct and constitute a product code with even parity on rows and columns. Moreover, each row and each column satisfy Definition 1.

The row and column parities in a product code are unique because the parities are encoded in separate bitfields. If the number of data rows is even, the column parities are 0s for each column. The column parities of 0s for each column violates Definition 1 (e.g., all of the elements in the last row are the same). This is true if the number of data columns is even. In the case that the number of data rows or columns is even, a virtual row or column is added to ensure that the parities remain unique in a similar manner as described above with reference to regular LID codes. If the number of data rows is even, the virtual row is added with a row set number (e.g., such as 0) for the row value, and the appropriate column number for each column entry. See FIG. 8 for m=6 in both rows and columns. FIG. 8 is a 7×7 product code with single row and single column parity encoded using an LID code. Column 7 is parity P and row 7 is parity Q.

Consider arrays with parity along lines of different slopes. For example, consider EBR codes. An EBR(p, r) code comprises p×p arrays where p is a prime number and r≥1, such that each line of slope j with a toroidal topology, 0≤j≤r−1, as well as each vertical line, has even parity. For example, FIG. 9 illustrates an element in EBR(5, 3), e.g., each column as well as each line of slope 0, 1, and 2, has even parity.

A product code comprising p×p arrays with parity on rows and columns is the special case EBR(p, 1). Each entry in an EBR code is a bit. Each entry may be a whole sector, a whole page, a whole storage device, etc. At least some of the aspects described herein achieve a unique LID which precedes each entry. The result of performing various operations as described herein includes two fields for the LID as for product codes. The two fields may be combined such that the $p^2$ possibilities are all distinct (e.g., as for the product codes). Since p−1 is an even number, use Construction B and let n=⌈$\log_2(p)$⌉. Let $c_i$ for 0≤i≤p−1 be the vectors of length n obtained by Construction B. For any integer l, denote by $\langle \ell \rangle_p$, the unique integer m such that 0≤i≤p−1 and m≡ℓ (mod p). In various instances, $\langle \ell \rangle_p$ may be interchangeable with $\langle \ell \rangle$. Make the following pair assignment to entry (i, j) for 0≤i and j≤p−1:

$$(i,j) \rightarrow (c\langle_{i-j}\rangle, c\langle_{i-2j}\rangle) \quad (4)$$

Assignment (4) is 1-1 and the p×p array of pairs given by the assignment has even parity on lines of slope j for 0≤j≤p−3 as well as even parity on the vertical lines. The assignment may be used for EBR(p, r) codes with r≤p−3.

Assignment (4) is illustrated in the following example for p=7.

Example 5

If p=7, then m=6 and n=3. Construction B gives the following LID(6, 3) code:
$c_0$=(001)
$c_1$=(110)
$c_2$=(010)
$c_3$=(101)
$c_4$=(100)
$c_5$=(011)
$c_6$=(111)

Assignment (4) is given by the 7×7 array shown in FIG. 10 for an EBR(7, r) code for 1≤r≤4.

All the possible pairs ($c_i$, $c_j$) are obtained from the assignment illustrated in FIG. 10. The XOR of the pairs over lines of slope j for 0≤j≤4 is zero. The XOR of the vertical lines is zero.

The LID encoding, although varying according to the dimensions, is optimal as described herein. For example, a product code with 256 rows and 10 columns has 2,560 unique block locations. The foregoing product code uses at least 12 bits. In this encoding, the row value takes 8 bits and the column value takes 4 bits for a total of 12 bits. There is no overhead using the various aspects described herein. Adding code set values adds no additional encoding overhead where the additional code set values are not encoded. For a system with 1,000,000 code sets, 20 additional bits are used for a total of 32 bits.

Consider an extension to the RAID 5 architecture for the LID in which only one parity symbol is added. Consider a RAID 6 architecture with 2 parity symbols, or any RAID architecture with any number of parity symbols. The individual codewords are encoded using a Reed-Solomon (RS) code. Assume that the length of a codeword is $2^b-1$. Then, if a is a primitive root in the field $GF(2^b)$, consider the codeword c=(1, α, $α^2$, ... $α^{q-1}$), where q=$2^b$. That codeword c is in any RS code of length q−1, in particular, in a RS code with two parity symbols, such as in RAID 6. Also, all the symbols are different, since, being that a is a primitive, the powers of a generate all the non-zero vectors of length b. Hence, this code has the desired properties for any number of parities. If the length of a codeword is less that q−1, virtual entries may be used in the same way as was done for one parity, described in detail above.

Various approaches disclosed herein encode block identification information into blocks belonging to an erasure correcting code in a manner such that the information may be verified both at read time and upon reconstruction. In a storage system, a plurality of data blocks may be protected by an erasure correcting code. In preferred approaches, the storage systems described herein include data protected by an erasure correcting code. The erasure correcting code may be any erasure correcting code known in the art. For example, the erasure correcting code may be a parity code, a Reed-Solomon code, a Blaum-Roth code, an Expanded Blaum-Roth code, etc.

Figure 11:
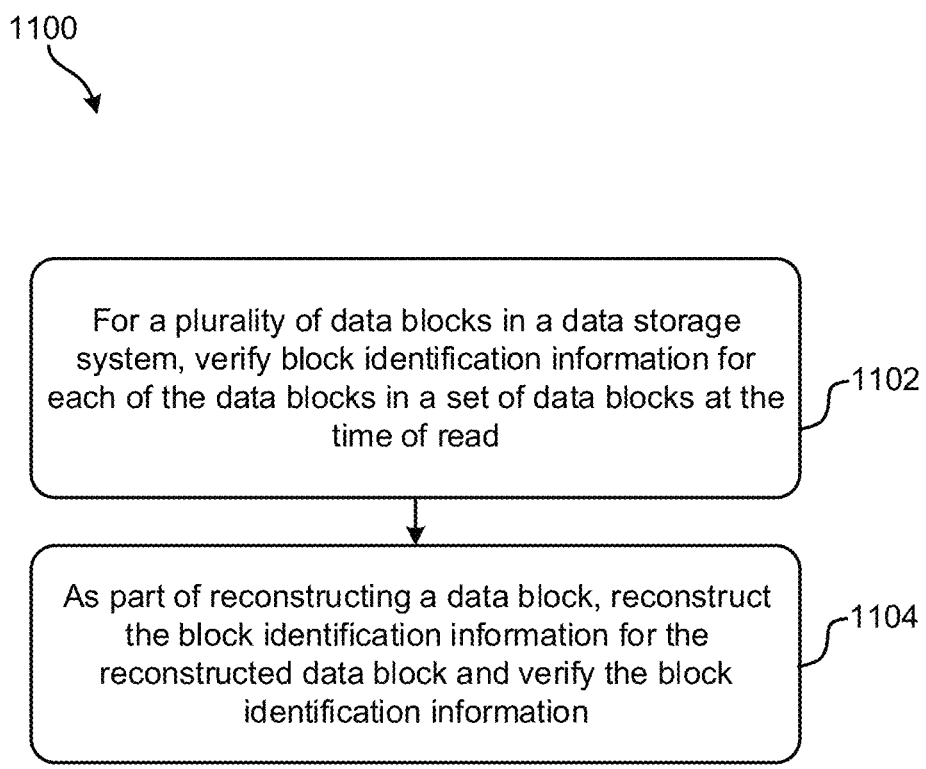
FIG. 11 is a flowchart of a method, in accordance with one aspect of the present invention.

Now referring to FIG. 11, a flowchart of a method 1100 is shown according to one aspect. The method 1100 may be performed in accordance with the present invention in any of the environments depicted in FIGS. 1-10, among others, in various aspects. Of course, more, or fewer operations than those specifically described in FIG. 11 may be included in method 1100, as would be understood by one of skill in the art upon reading the present descriptions.

Each of the steps of the method 1100 may be performed by any suitable component of the operating environment. For example, in various aspects, the method 1100 may be partially or entirely performed by computers, or some other device having one or more processors therein. The processor, e.g., processing circuit(s), chip(s), and/or module(s) implemented in hardware and/or software, and preferably having at least one hardware component may be utilized in any device to perform one or more steps of the method 1100. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 11, method 1100 includes operation 1102. Operation 1102 includes, for a plurality of data blocks in a data storage system, verifying block identification information for each of the data blocks in a set of data blocks at the time of read. The data storage system comprises a plurality of data blocks. A set of data blocks are preferably protected by an erasure correcting code. The erasure correcting code may be any erasure correcting code known in the art.

Each of the data blocks in the set of data blocks includes block identification information where the block identification information for each of the data blocks is unique to the respective data blocks. In a preferred approach, the block identification information for each of the data blocks includes a block ID for each of the data blocks. A block ID preferably indicates the block's address (e.g., a unique identifier of the block's location). In various approaches, the block identification information and/or the block ID may be represented by a string of bits which are unique to the respective data blocks. The block ID may be interchangeably referred to as a block identification information symbol as used throughout the present disclosure. The block identification information may be generated and/or assigned to each of the data blocks according to any of the aspects described in detail above.

In various approaches, the block identification information for each of the data blocks is verified at the time of read according to any of the approaches described herein. The unique block identification information is preferably encoded in each block of an erasure coded system such that the block identification information may be recovered via a reconstruct operation as would be understood by one having ordinary skill in the art upon reading the present disclosure.

Operations 1104 includes, as part of reconstructing a data block, reconstructing the block identification information for the reconstructed data block, and verifying the block identification information. The verification of the block identification information following reconstruction of the data block may be performed according to any of the various aspects described in detail above. Verifying the block identification information following a reconstruction operation (e.g., and/or as part of the reconstruction operation) provides protection against corruption mechanisms occurring after the block read operation. For example, such verification provides protection against a buffer addressing error that results in receiving data from a data block not belonging to a particular parity equation being used during reconstruction.

In some approaches, method 1100 includes returning the block identification information and the reconstructed data block for providing end-to-end protection in the storage system according to various aspects described in detail above. The end-to-end protection may be for the data blocks, the block identification information, verification of the block identification information, etc., or any combination thereof. The block identification information preferably provides end-to-end protection where the block identification information is encoded into the erasure code and the protection is provided throughout the read and write process.

In various approaches, method 1100 includes determining whether the verification of the block identification information fails. The verification of the block identification information may fail where the block identification information at the time of reconstruction does not match the block identification information at the time of read in one exemplary approach. In response to determining that the verification of the block identification information fails, the data block is declared to be erased as would be understood by one having ordinary skill in the art in view of the present disclosure.

A data storage system implementing the various operations described above may comprise at least two parity blocks. The block identification information for each of the parity blocks may be the XOR of the block identification information of the other of the data blocks in the set of data blocks. The block identification information of the data blocks and of the at least two parity blocks are symbols in a codeword of a Reed-Solomon code such that the symbols for each block are different from one another. Further, the codeword in the Reed-Solomon code may be the vector (1, $\alpha$, $\alpha^2$, $\alpha^{q-1}$), where $q=2^b$ and $\alpha$ is a primitive element in the finite field GF(q). The length of the codeword in the Reed-Solomon code may be shorter than $2^b-1$. Some of the entries in the vector may be virtual and not assigned to any data block as would be understood by one having ordinary skill in the art in view of the present disclosure.

In various aspects, the data blocks and the parity blocks are distributed in a two dimensional array where the XOR of the blocks in rows and columns have even parity. Again, each block in the array has a unique block identification information symbol. The XOR of the block identification information symbols in each row and in each column are equal to zero. The array may be a p×p array in an Expanded Blaum-Roth code, where p is a prime number. Another array comprising the block identification information symbols as described above is preferably also in an Expanded Blaum-Roth code. The block identification information symbols may be divided into two halves where an array comprising the first half of the block identification information symbols and an array comprising the second half of the block identification information symbols are also in an Expanded Blaum-Roth code.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. The processor may be of any configuration as described herein, such as a discrete processor or a processing circuit that includes many components such as processing hardware, memory, I/O interfaces, etc. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A data storage system, comprising:
    a processor; and
    logic integrated with the processor, executable by the processor, or integrated with and executable by the processor, the logic being configured to:
    store a plurality of data blocks, wherein a set of the data blocks are protected by an erasure correcting code, wherein each of the data blocks in the set of data blocks includes block identification information;
    verify the block identification information for each of the data blocks in the set of data blocks at a time of read; and
    as part of reconstructing a data block, reconstruct the block identification information for the data block and verify the block identification information.

2. The data storage system of claim 1, wherein the block identification information for each of the data blocks is unique thereto.

3. The data storage system of claim 1, comprising logic configured to declare that one of the data blocks is erased in response to determining that the verification of the block identification information fails.

4. The data storage system of claim 1, comprising at least two parity blocks.

5. The data storage system of claim 4, wherein the block identification information of the data blocks and of the at least two parity blocks are symbols in a codeword of a Reed-Solomon code such that all the symbols are different, wherein the codeword in the Reed-Solomon code is the vector $(1, \alpha, \alpha^2, \ldots, \alpha^{q-1})$, where $q=2^b$ and $\alpha$ is a primitive element in the finite field GF(q), where b is the length of the vector.

6. The data storage system of claim 5, wherein the length of the codeword in the Reed-Solomon code is $2^b-1$.

7. The data storage system of claim 5, wherein the length of the codeword in the Reed-Solomon code is shorter than $2^b-1$.

8. The data storage system of claim 5, wherein some entries in the vector are virtual and not assigned to any data block.

9. The data storage system of claim 4, wherein the data blocks and the parity blocks are distributed in a two dimensional array where the XOR of the blocks in rows and columns have even parity, wherein each of the blocks in the array has a unique block identification information symbol, wherein the XOR of the block identification information symbols in each row and in each column are equal to zero.

10. The data storage system of claim 9, wherein the array is a p×p array in an Expanded Blaum-Roth code, wherein p a prime number.

11. The data storage system of claim 9, wherein an array comprising the block identification information symbols is also in an Expanded Blaum-Roth code.

12. The data storage system of claim 11, wherein the array comprising the block identification information symbols is divided into first and second halves, wherein an array comprising the first half of the block identification information symbols is in an Expanded Blaum-Roth code and an array comprising the second half of the block identification information symbols is also in an Expanded Blaum-Roth code.

13. A data storage system, comprising:
    a processor; and
    logic integrated with the processor, executable by the processor, or integrated with and executable by the processor, the logic being configured to:
    store a plurality of data blocks, wherein a set of the data blocks are protected by an erasure correcting code, wherein each of the data blocks in the set of data blocks includes block identification information;
    store at least two parity blocks, wherein each of the at least two parity blocks includes block identification information, wherein the block identification information of the data blocks and of the at least two parity blocks are symbols in a codeword of a Reed-Solomon code such that all the symbols are different;
    verify the block identification information for each of the data blocks in the set of data blocks at a time of read;
    as part of reconstructing a data block, reconstruct the block identification information for the data block and verify the block identification information; and
    return the block identification information and the reconstructed data block for providing end-to-end protection in the storage system.

14. The data storage system of claim 13, wherein the block identification information for each of the data blocks is unique thereto.

15. The data storage system of claim 13, comprising logic configured to declare that one of the data blocks is erased in response to determining that the verification of the block identification information fails.

16. The data storage system of claim 13, wherein the length of the codeword in the Reed-Solomon code is $2^b-1$, wherein the codeword in the Reed-Solomon code is the vector $(1, \alpha, \alpha^2, \ldots, \alpha^{q-1})$, where $q=2^b$ and $\alpha$ is a primitive element in the finite field GF(q), where b is the length of the vector.

17. The data storage system of claim 13, wherein the length of the codeword in the Reed-Solomon code is shorter than $2^b-1$, wherein the codeword in the Reed-Solomon code is the vector $(1, \alpha, \alpha^2, \ldots, \alpha^{q-1})$, where $q=2^b$ and $\alpha$ is a primitive element in the finite field GF(q), where b is the length of the vector.

18. The data storage system of claim 13, wherein the data blocks and the parity blocks are distributed in a two dimensional array where the XOR of the blocks in rows and columns have even parity, wherein each of the blocks in the array has a unique block identification information symbol, wherein the XOR of the symbols in each row and in each column are equal to zero.

19. The data storage system of claim 18, wherein the array is a p×p array in an Expanded Blaum-Roth code, wherein p a prime number.

20. The data storage system of claim 18, wherein an array comprising the block identification information symbols is also in an Expanded Blaum-Roth code.

21. The data storage system of claim 20, wherein the array comprising the block identification information symbols is divided into first and second halves, wherein an array comprising the first half of the block identification information symbols is in an Expanded Blaum-Roth code and an array comprising the second half of the block identification information symbols is also in an Expanded Blaum-Roth code.

22. A computer-implemented method, comprising:
for a plurality of data blocks in a data storage system, verifying block identification information for each of the data blocks in a set of data blocks at a time of read, wherein a set of data blocks are protected by an erasure correcting code, wherein each of the data blocks in the set of data blocks includes the block identification information; and
as part of reconstructing a data block, reconstructing the block identification information for the data block and verifying the block identification information.

23. The method of claim 22, wherein the block identification information for each of the data blocks is unique thereto.

24. A computer-implemented method, comprising:
for a plurality of data blocks in a data storage system, verifying block identification information for each of the data blocks in a set of data blocks at a time of read, wherein the data storage system comprises at least two parity blocks, wherein a set of the data blocks are protected by an erasure correcting code, wherein each of the data blocks in the set of data blocks includes the block identification information, wherein the block identification information of the data blocks and of the at least two parity blocks are symbols in a codeword of a Reed-Solomon code such that all the symbols are different;
as part of reconstructing a data block, reconstructing the block identification information for the data block and verifying the block identification information; and
returning the block identification information and the reconstructed data block for providing end-to-end protection in the storage system.

25. A computer program product, the computer program product comprising:
one or more computer readable storage media, and program instructions collectively stored on the one or more computer readable storage media, the program instructions comprising:
program instructions to, for a plurality of data blocks in a data storage system, verify, by the computer, block identification information for each of the data blocks in a set of the data blocks at a time of read,
wherein a set of data blocks are protected by an erasure correcting code, wherein each of the data blocks in the set of data blocks includes the block identification information; and
program instructions to, as part of reconstructing a data block, reconstruct, by the computer, the block identification information for the data block and verify the block identification information.

* * * * *